(12) United States Patent
Jo et al.

(10) Patent No.: US 10,454,470 B2
(45) Date of Patent: Oct. 22, 2019

(54) CONTROL BUFFER CIRCUIT AND RADIO FREQUENCY SWITCH FOR DUAL MODE OPERATION

(71) Applicant: Samsung Electro-Mechanics Co., Ltd., Suwon-si (KR)

(72) Inventors: Byeong Hak Jo, Suwon-si (KR); Jeong Hoon Kim, Suwon-si (KR); Jong Ok Ha, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/106,276

(22) Filed: Aug. 21, 2018

(65) Prior Publication Data

US 2019/0238127 A1 Aug. 1, 2019

(30) Foreign Application Priority Data

Jan. 30, 2018 (KR) ......................... 10-2018-0011199

(51) Int. Cl.
*G01R 1/30* (2006.01)
*H03K 17/51* (2006.01)
*G01R 31/30* (2006.01)
*G11C 5/14* (2006.01)

(52) U.S. Cl.
CPC ............... *H03K 17/51* (2013.01); *G01R 1/30* (2013.01); *G01R 31/3004* (2013.01); *G11C 5/143* (2013.01); *H03F 2200/451* (2013.01)

(58) Field of Classification Search
CPC .................................. H03K 15/51; G01R 1/30
See application file for complete search history.

(56) References Cited

U.S. PATENT DOCUMENTS

| 9,712,158 B1* | 7/2017 | Cavus ................. H03K 17/687 |
| 2015/0180463 A1* | 6/2015 | Peltonen ............ H03K 17/0828 327/109 |
| 2015/0214931 A1 | 7/2015 | Yoo et al. |

FOREIGN PATENT DOCUMENTS

KR            10-161680 B1     4/2016

* cited by examiner

*Primary Examiner* — Tuan H Nguyen
(74) *Attorney, Agent, or Firm* — NSIP Law (57) ABSTRACT

A control buffer circuit includes a voltage detection circuit configured to detect whether a received voltage is a negative voltage or a ground voltage and provide a voltage detection signal based on a result of the detecting, and a buffer circuit configured to provide a switching signal based on the voltage detection signal, wherein the switching signal comprises a positive voltage as a switching-on level voltage and includes one or more of the ground voltage and the negative voltage as a switching-off level voltage.

20 Claims, 8 Drawing Sheets

CONTROL BUFFER CIRCUIT AND RADIO FREQUENCY SWITCH FOR DUAL MODE OPERATION

CROSS-REFERENCE TO RELATED APPLICATION

This application claims the benefit under 35 U.S.C. § 119(a) of Korean Patent Application No. 10-2018-0011199 filed on Jan. 30, 2018 in the Korean Intellectual Property Office, the entire disclosure of which is incorporated herein by reference for all purposes.

BACKGROUND

1. Field

The present disclosure relates to a control buffer circuit and a radio frequency switch for dual mode operation.

2. Description of Related Art

Typically, a power amplifier module (PAM) that supports various frequency bands may include a radio frequency (RF) switch that selects a plurality of bands, a filter, and a plurality of power amplifiers (PAs) that amplify a RF signal.

The RF switch of the PAM may vary in terms of shape, depending on the configurations of the PA and the filter, and since the PA is typically designed to handle wideband communications including a plurality of bands, a single pole multi-throw (SPMT) switch having one input port and a plurality of output ports may be used as the RF switch.

One PAM typically includes a plurality of single pole double-throw (SPDT) switches. Some SPDT switches may use a negative voltage as an off-level voltage for an off path and isolation for processing a high-power signal, while other SPDT switches may use a zero voltage (or ground voltage) as the off-level voltage without using the negative voltage when processing a low power signal.

However, since the typical PAM includes the SPDT switches which use different off-level voltages and the SPDT switches which use different off-level voltages are separately produced by different manufacturing processes, manufacturing costs of the SPDT switch may be increased and manufacturing costs of the PAM may thus be increased.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a control buffer circuit includes a voltage detection circuit configured to detect whether a received voltage is a negative voltage or a ground voltage and provide a voltage detection signal based on a result of the detecting; and, and a buffer circuit configured to provide a switching signal based on the voltage detection signal, wherein the switching signal comprises a positive voltage as a switching-on level voltage and includes one or more of the ground voltage and the negative voltage as a switching-off level voltage.

The buffer circuit may be configured to generate the switching signal based on the voltage detection signal and a band selection signal.

The voltage detection circuit may be configured to provide the voltage detection signal with a first voltage when the received voltage is the negative voltage, and provide the voltage detection signal with a second voltage having a magnitude different from a magnitude of the first voltage when the received voltage is the ground voltage.

The buffer circuit may include a first buffer circuit configured to generate a first switching signal determined according to the voltage detection signal and a first band selection signal of the band selection signal.

The first buffer circuit may include a negative voltage (VNEG) buffer configured to provide one of the positive voltage and the negative voltage as the switching level voltage of the switching signal based on the first band selection signal when the voltage detection signal is the first voltage, and a ground voltage (VSS) buffer configured to provide one of the positive voltage and the ground voltage as the switching level voltage of the switching signal based on the first band selection signal when the voltage detection signal is the second voltage.

The buffer circuit may include first to n-th buffer circuits configured to generate first to n-th switching signals that are determined based on the voltage detection signal and first to n-th band selection signals of the band selection signal.

The first buffer circuit may include a VNEG buffer configured to provide one of the positive voltage and the negative voltage as the switching level voltage of the switching signal based on the first band selection signal when the voltage detection signal is the first voltage, and a VSS buffer configured to provide one of the positive voltage and the ground voltage as the switching level voltage of the switching signal based on the first band selection signal when the voltage detection signal is the second voltage.

The n-th buffer circuit may include a VNEG buffer configured to provide one of the positive voltage and the negative voltage as the switching level voltage of the switching signal based on the n-th band selection signal when the voltage detection signal is the first voltage, and a VSS buffer configured to provide one of the positive voltage and the ground voltage as the switching level voltage of the switching signal based on the n-th band selection signal when the voltage detection signal is the second voltage.

In a general aspect, a radio frequency switch includes a control buffer circuit configured to generate a switching signal based on a band selection signal and a received voltage supplied from an external source, and a switching circuit configured to switch at least one signal path in response to receiving the switching signal, wherein the control buffer circuit may include a voltage detection circuit configured to detect a voltage magnitude of the received voltage and provide a voltage detection signal, and a buffer circuit configured to provide a switching signal based on the received voltage detection signal.

The buffer circuit may be configured to provide the switching signal based on the received voltage detection signal and the band selection signal.

The voltage detection circuit may be configured to provide the voltage detection signal with a first voltage when the received voltage is the negative voltage, and provide the voltage detection signal with a second voltage having a magnitude different from a magnitude of the first voltage when the received voltage is the ground voltage.

The buffer circuit may include a first buffer circuit that generates a first switching signal determined based on the voltage detection signal and a first band selection signal of the band selection signal.

The first buffer circuit may include a negative voltage (VNEG) buffer configured to provide one of the positive voltage and the negative voltage as the switching level voltage of the switching signal based on the first band selection signal when the voltage detection signal is the first voltage, and a ground voltage (VSS) buffer configured to provide one of the positive voltage and the ground voltage as the switching level voltage of the switching signal based on the first band selection signal when the voltage detection signal is the second voltage.

The buffer circuit may include first to n-th buffer circuits generating first to n-th switching signals determined based on the voltage detection signal and first to n-th band selection signals of the band selection signal.

The first buffer circuit may include a VNEG buffer configured to provide one of the positive voltage and the negative voltage as the switching level voltage of the switching signal based on the first band selection signal when the voltage detection signal is the first voltage, and a VSS buffer configured to provide one of the positive voltage and the ground voltage as the switching level voltage of the switching signal based on the first band selection signal when the voltage detection signal is the second voltage.

The n-th buffer circuit may include a VNEG buffer configured to provide one of the positive voltage and the negative voltage as the switching level voltage of the switching signal based on the n-th band selection signal when the voltage detection signal is the first voltage, and a VSS buffer configured to provide one of the positive voltage and the ground voltage as the switching level voltage of the switching signal based on the n-th band selection signal when the voltage detection signal is the second voltage.

in a general aspect, a radio frequency switch includes a voltage detection circuit configured to detect a magnitude of a voltage, and generate a voltage detection signal based on the detected magnitude of the voltage, a control buffer configured to generate a switching signal based on a value of the voltage detection signal; and a switching circuit configured to perform an operation of switching one or more signal paths in response to receiving the switching signal.

The detecting of the magnitude of the voltage may include determining whether the detected voltage is a negative voltage (VNEG) or a ground voltage (VSS).

The voltage detection circuit may be configured to provide the voltage detection signal with a first voltage when the detected voltage is VNEG, and provide the voltage detection signal with a second voltage having a magnitude different from a magnitude of the first voltage when the detected voltage is VSS.

The control buffer may be configured to generate a plurality of switching signals based on a value of the voltage detection signal, and the switching circuit is configured to perform an operation of switching a plurality of signal paths in response to receiving the switching signal.

Other features and aspects will be apparent from the following detailed description, the drawings, and the claims.

Throughout the drawings and the detailed description, the same reference numerals refer to the same elements. The drawings may not be to scale, and the relative size, proportions, and depiction of elements in the drawings may be exaggerated for clarity, illustration, and convenience. In the drawings, for example, due to manufacturing techniques and/or tolerances, modifications of the shape shown may be estimated. Thus, the examples described herein should not be construed as being limited to the particular shapes of regions shown herein, for example, the examples described herein include a change in shape as a result of manufacturing.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Figure 1:
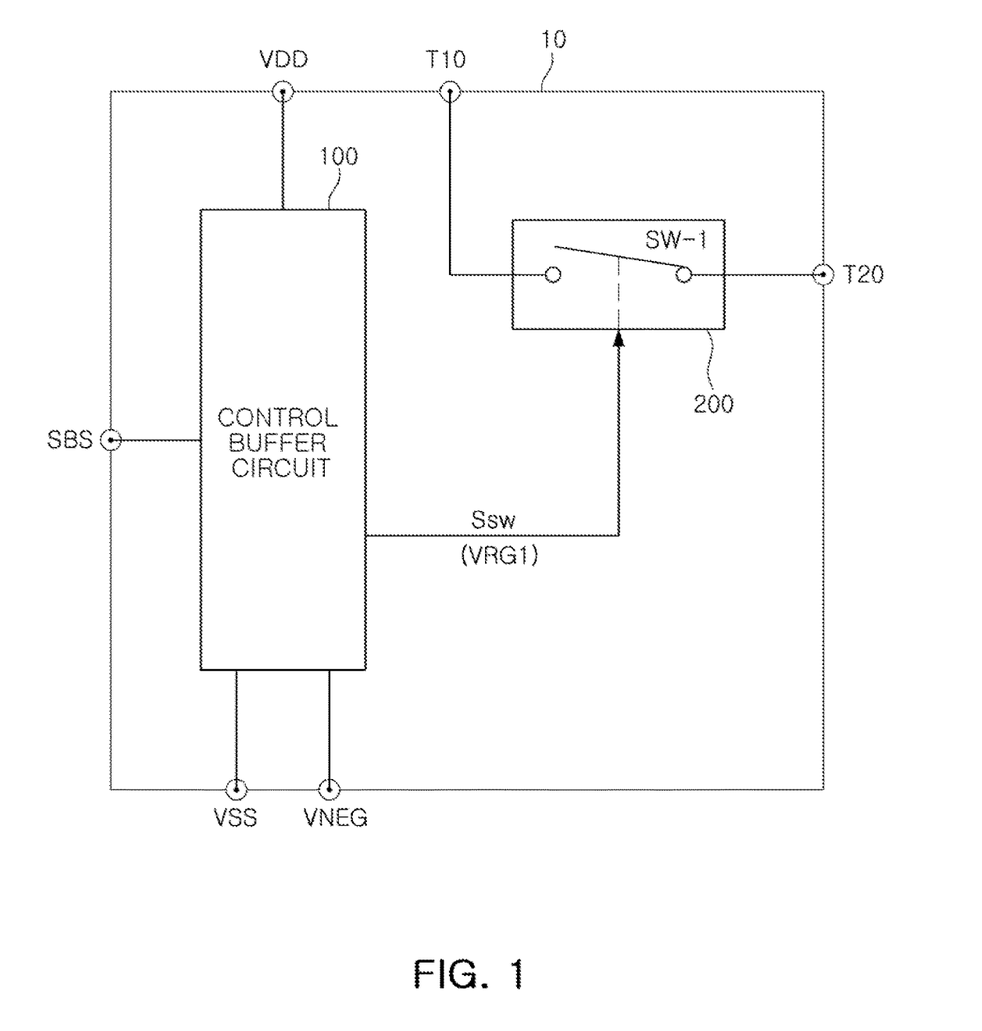
FIG. 1 is a view illustrating an example of a radio frequency (RF) switch.

FIG. 1 illustrates an example of a radio frequency (RF) switch.

Referring to FIG. 1, a radio frequency switch 10 may include a control buffer circuit 100 and a switching circuit 200.

It is noted that use of the term "may" herein with respect to an example or embodiment, e.g., as to what an example or embodiment may include or implement, means that at least one example or embodiment exists where such a feature is included or implemented while all examples and embodiments are not limited thereto.

The control buffer circuit 100 may be supplied with an operation voltage VDD, a ground voltage VSS, and a negative voltage VNEG, and may generate a switching signal Ssw including at least a first switching signal VRG1 based on a band selection signal SBS and an off-level voltage Voff supplied from an external source. Although a single switching signal VRG1 is illustrated, this is only an example, and multiple switching signals VRG1 to VRGn may be implemented.

As an example, the operation voltage VDD, which is a voltage greater than the ground voltage, may be +2.5V, the ground voltage VSS may be a zero voltage, and the negative voltage VNEG, which is a voltage smaller than the ground voltage, may be −2.5V. The above-mentioned voltages are not limited thereto. The band selection signal SBS may include a signal that generates switching signals corresponding to the number of signal paths to be processed by the applied radio frequency switch.

The switching circuit 200 may switch at least one signal path in response to receiving the switching signal Ssw.

As an example, the switching circuit 200 may include a first switch circuit SW-1 connected between a first terminal T10 and a second terminal T20. The first switch circuit SW-1 may perform a switching operation in response to receiving the first switching signal VRG1 of the switching signal Ssw.

As an example, the first terminal T10 may be a terminal connected to an antenna and the second terminal T20 may be a transmission terminal or a reception terminal or a transmission/reception terminal. However, these are only examples, and the first terminal T10 may be connected to devices other than antennas. As an example, the first switching signal VRG1 may be a gate signal, but is not limited thereto.

In the respective drawings of the present disclosure, unnecessarily overlapped descriptions are possibly omitted for components having the same reference numeral and the same function, and differences in the respective drawings will be described.

Figure 2:
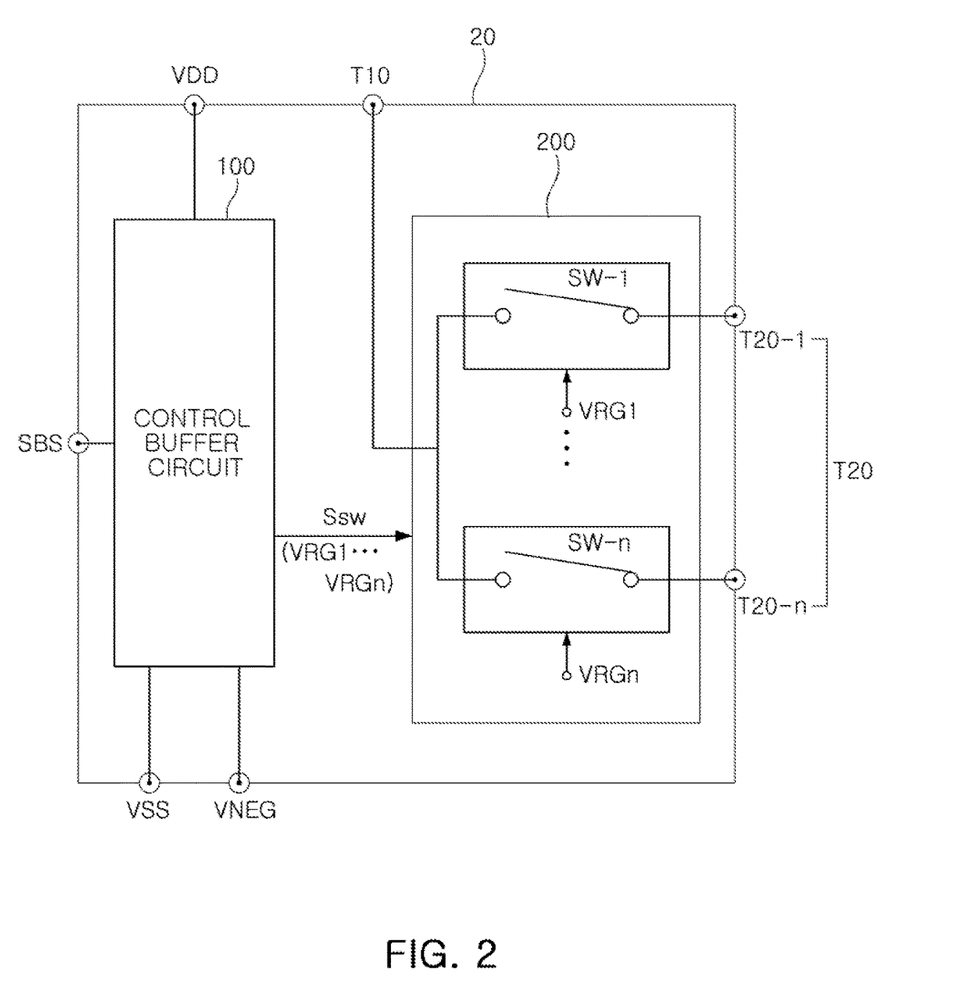
FIG. 2 is a view illustrating an example of a radio frequency switch.

FIG. 2 illustrates an example of a radio frequency switch 20.

Referring to FIG. 2, a radio frequency switch 20 according to an example may include a control buffer circuit 100 and a switching circuit 200. The control buffer circuit 100 of FIG. 2 and the switching circuit 200 of FIG. 2 may respectively correspond to the control buffer circuit 100 of FIG. 1 and the switching circuit 200 of FIG. 1.

The control buffer circuit 100 may be supplied with an operation voltage VDD, a ground voltage VSS, and a negative voltage VNEG, and may generate a switching signal Ssw including first to n-th switching signals VRG1 to VRGn based on a band selection signal SBS and an off-level voltage Voff supplied from an external source.

The switching circuit 200 may switch a plurality of signal paths in response to the switching signal Ssw. As an example, the switching circuit 200 may include first to n-th switch circuits SW-1 to SW-n connected between a first terminal T10 and each of a plurality of second terminals T20 (T20-1 to T20-n). The first to n-th switching circuits SW-1 to SW-n may perform a switching operation in response to receiving each of the first to n-th switching signals VRG1 to VRGn of the switching signal Ssw.

As an example, the first terminal T10 may be a terminal connected to an antenna and each of the plurality of second terminals T20 (T20-1 to T20-n) may be a transmission terminal or a reception terminal or a transmission/reception terminal.

In FIGS. 1 and 2, as an example, each of the first to n-th switch circuits Sw-1 to SW-n may include a series switch. As another example, each of the first to n-th switch circuits SW-1 to SW-n may include a series switch connected to a signal path and a shunt switch connected between the signal path and a ground.

Here, the series switch and the shunt switch may include a plurality of transistors which are connected to each other in series. As an example, the plurality of transistors may be, but are not limited to, metal oxide semiconductor (MOS) transistors, and each of the plurality of MOS transistors may be supplied with a corresponding switching signal through a gate to perform a switching operation.

Figure 3:
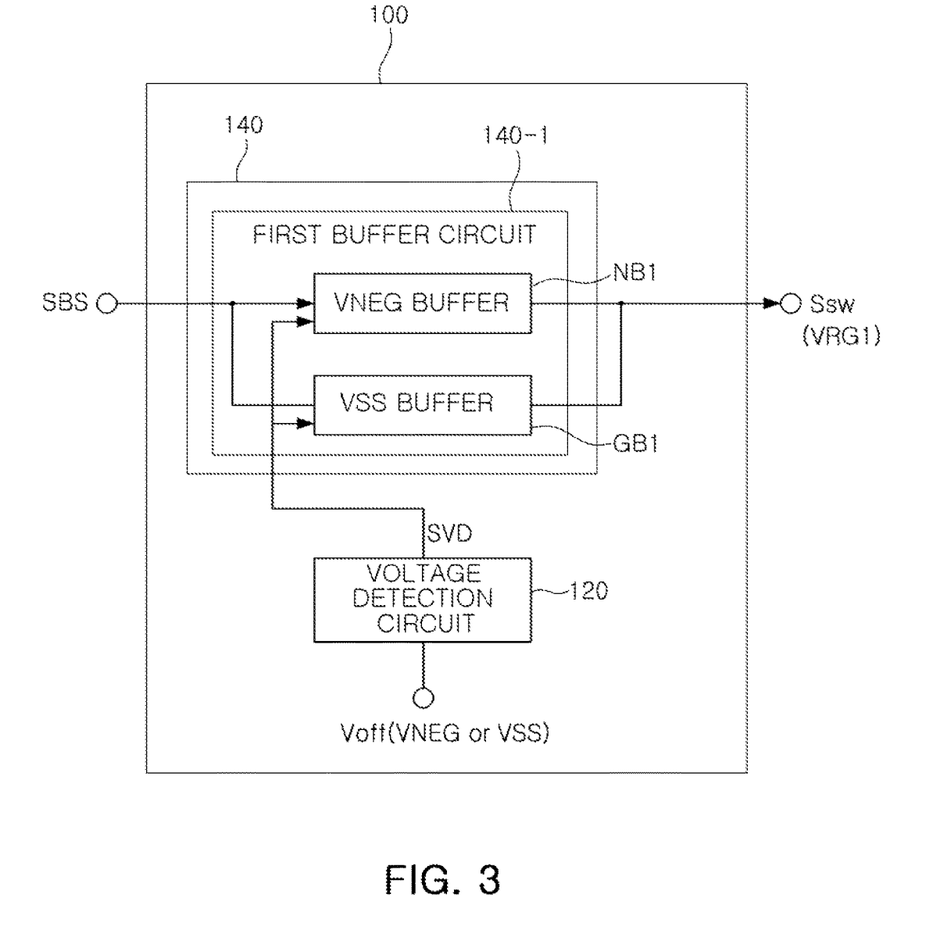
FIG. 3 is a view illustrating an example of a control buffer circuit.
Figure 4:
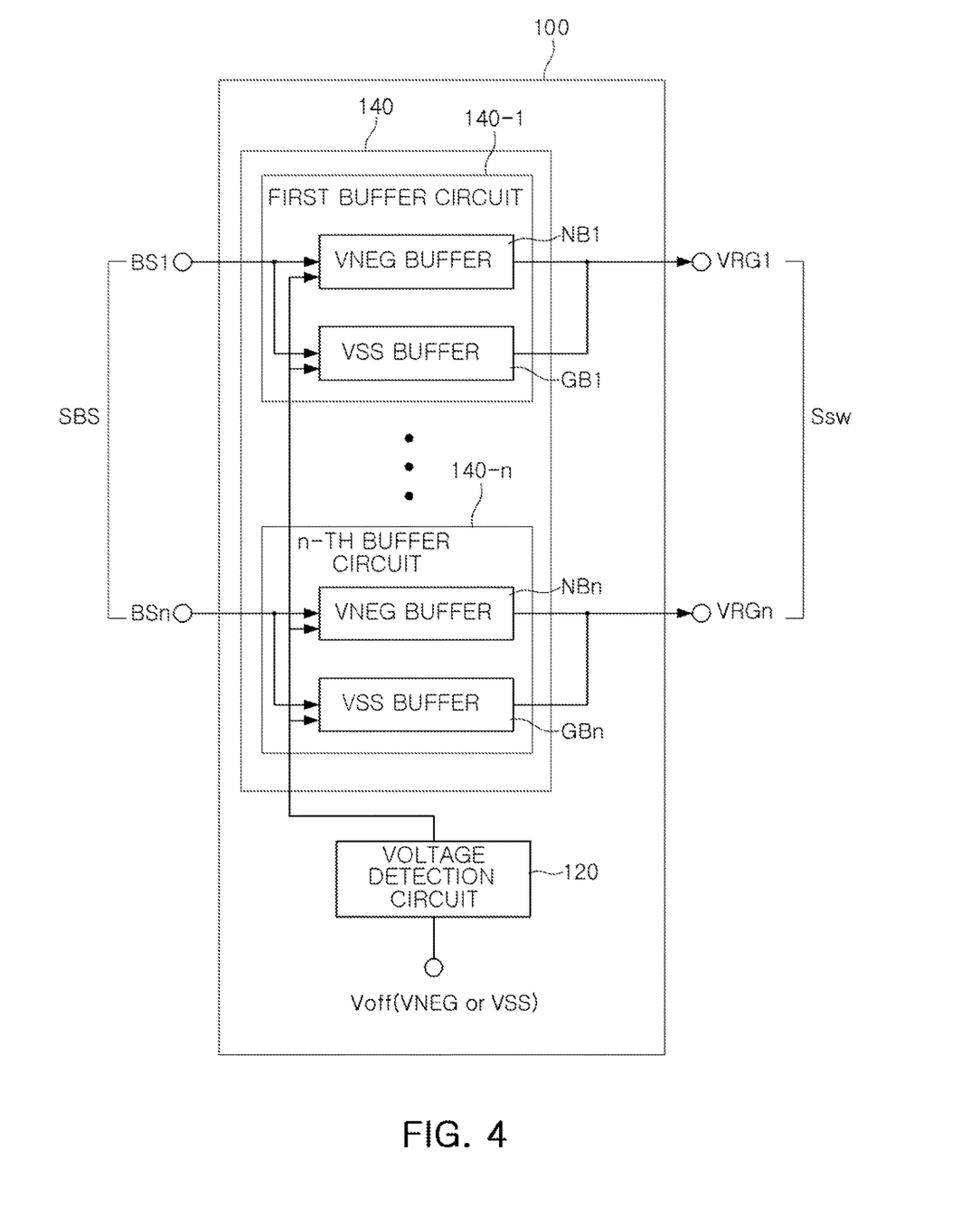
FIG. 4 is a view illustrating another example of a control buffer circuit.

FIG. 3 illustrates an example of a control buffer circuit 100, and FIG. 4 illustrates another example of a control buffer circuit 100.

Referring to FIGS. 3 and 4, the control buffer circuit 100 may include a voltage detection circuit 120 and a buffer circuit 140.

The voltage detection circuit 120 may detect a voltage received from an external source. Specifically, the voltage detection circuit 120 may detect whether a voltage or an off-level voltage Voff supplied from an external source is a negative voltage (e.g., VNEG) or a ground voltage (e.g., VSS) and generate a voltage detection signal SVD. As an example, the voltage detection signal SVD may reach a high level when the off-level voltage Voff is the negative voltage (VNEG), and may reach a low level when the off-level voltage Voff is the ground voltage (VSS).

The buffer circuit 140 may generate the switching signal Ssw based on the voltage detection signal SVD and a band selection signal SBS. As an example, the switching signal Ssw may include a positive voltage +VDD as a switching-on level voltage and include a ground voltage (e.g., VSS) or a negative voltage (e.g., −VDD) as a switching-off level voltage.

Referring to FIG. 3, the buffer circuit 140 may include a first buffer circuit 140-1. The first buffer circuit 140-1 may generate a first switching signal VRG1(Ssw) determined according to the voltage detection signal SVD and a first band selection signal BS1 of the band selection signal SBS.

As an example, the first buffer circuit 140-1 may include a NEG buffer NB1 and a VSS (or ground) buffer GB1.

When the voltage detection signal SVD is a first voltage V1, the VNEG buffer NB1 may provide one of a positive voltage (e.g., +VDD) and a negative voltage (e.g., −VDD) as the switching level voltage of the switching signal Ssw according to the first band selection signal BS1.

When the voltage detection signal SVD is a second voltage V2, the VSS buffer GB1 may provide one of a positive voltage (e.g., +VDD) and a ground voltage (e.g., VSS) as the switching level voltage of the switching signal Ssw according to the first band selection signal BS1.

Referring to FIG. 4, the buffer circuit 140 may include first to n-th buffer circuits 140-1 to 140-n.

The first to n-th buffer circuits 140-1 to 140-n may generate first to n-th switching signals VRG1 to VRGn (Ssw) determined according to the voltage detection signal SVD and first to n-th band selection signals BS1 to BSn of the band selection signal SBS.

The first buffer circuit 140-1 may include a VNEG buffer NB1 and a VSS buffer GB1.

When the voltage detection signal SVD is a first voltage V1, the VNEG buffer NB1 may provide one of the positive voltage (e.g., +VDD) and the negative voltage (e.g., −VDD) as the switching level voltage of the switching signal Ssw according to the first band selection signal BS1. As an example, when the first band selection signal BS1 is a high level voltage, the switching signal Ssw may be the positive voltage, and when the first band selection signal BS1 is a low level voltage, the switching signal Ssw may be the negative voltage.

When the voltage detection signal SVD is a second voltage V2, the VSS buffer GB1 may provide one of the positive voltage (e.g., +VDD) and the ground voltage (e.g., VSS) as the switching level voltage of the switching signal Ssw according to the first band selection signal BS1. As an example, when the first band selection signal BS1 is a high level voltage, the switching signal Ssw may be the positive voltage, and when the first band selection signal BS1 is a low level voltage, the switching signal Ssw may be the ground voltage.

The n-th buffer circuit 140-n may include a VNEG buffer NBn and a VSS buffer GBn.

When the voltage detection signal SVD is a first voltage V1, the VNEG buffer NBn may provide one of the positive voltage (e.g., +VDD) and the negative voltage (e.g., −VDD) as the switching level voltage of the switching signal Ssw according to the n-th band selection signal BSn. As an example, when the nth band selection signal BSn is a high-level voltage, the switching signal Ssw may be the positive voltage, and when the nth band selection signal BSn is a low-level voltage, the switching signal Ssw may be the negative voltage.

When the voltage detection signal SVD is a second voltage V2, the VSS buffer GBn may provide one of the positive voltage (e.g., +VDD) and the ground voltage (e.g., VSS) as the switching level voltage of the switching signal Ssw according to the n-th band selection signal BSn. As an example, when the first band selection signal BSn is a high-level voltage, the switching signal Ssw may be the positive voltage, and when the first band selection signal BSn is a low-level voltage, the switching signal Ssw may be the ground voltage.

Figure 5:
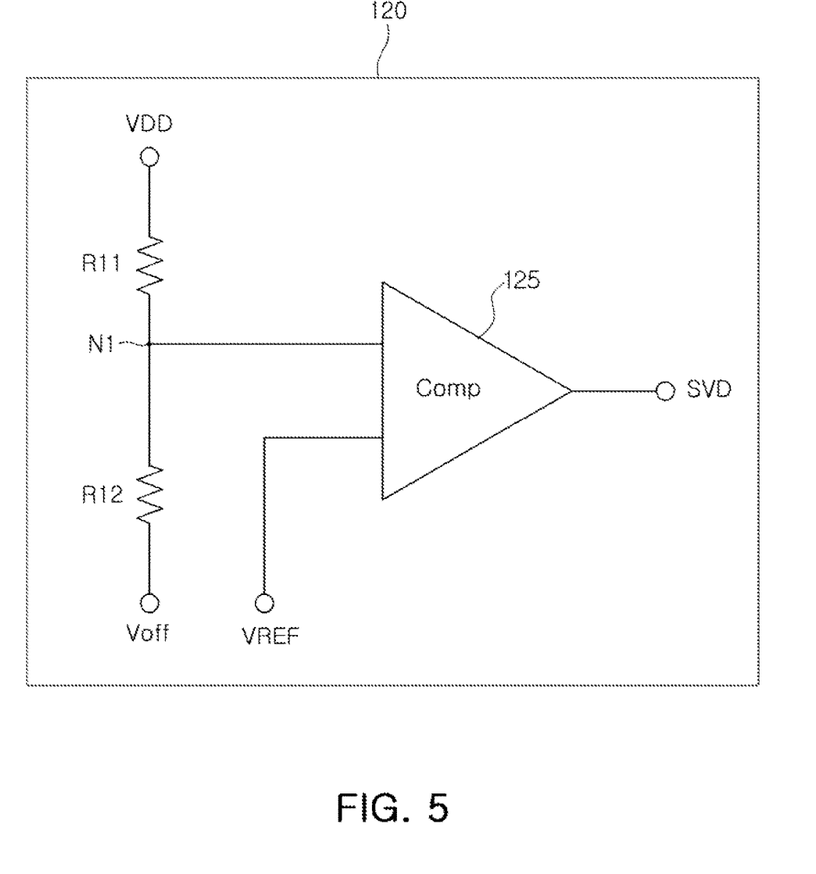
FIG. 5 is a view illustrating a voltage detection circuit.

FIG. 5 illustrates an example of a voltage detection circuit 120.

In addition to the description of FIG. 5 below, the descriptions of FIGS. 1-4 are also applicable to FIG. 5, and are incorporated herein by reference. Thus, the above description may not be repeated here.

Referring to FIG. 5, the voltage detection circuit 120 may provide the voltage detection signal SVD having a first voltage V1 when the off-level voltage Voff is the negative voltage VNEG, and may provide the voltage detection signal SVD having a second voltage V2 when the off-level voltage Voff is the ground voltage VSS.

As an example, the voltage detection circuit 120 may include a comparator Comp 125 having a first resistor R11 and a second resistor R12 which are connected in series between an operation voltage VDD terminal and an off-voltage Voff terminal, a first input terminal (an inverting input terminal or a non-inverting input terminal) connected to a first connection node N1 of the first resistor R11 and the second resistor R12, and a second input terminal (a non-inverting input terminal or an inverting input terminal) connected to a reference voltage (VREF) terminal.

When the off-level voltage Voff is the negative voltage VNEG, the comparator Comp may make a voltage of the first connection node N1 lower than the reference voltage VREF, and in this case, the comparator Comp may provide the voltage detection signal having the first voltage V1, at the high level. As an example, the first voltage V1 may be +2.5V.

On the other hand, when the off-level voltage Voff is the ground voltage VSS, the comparator Comp may make the voltage of the first connection node N1 higher than the reference voltage VREF, and in this case, the comparator Comp may provide the voltage detection signal SVD having the second voltage V2, at the low level. As an example, the second voltage V2 may be a zero voltage.

Figure 6:
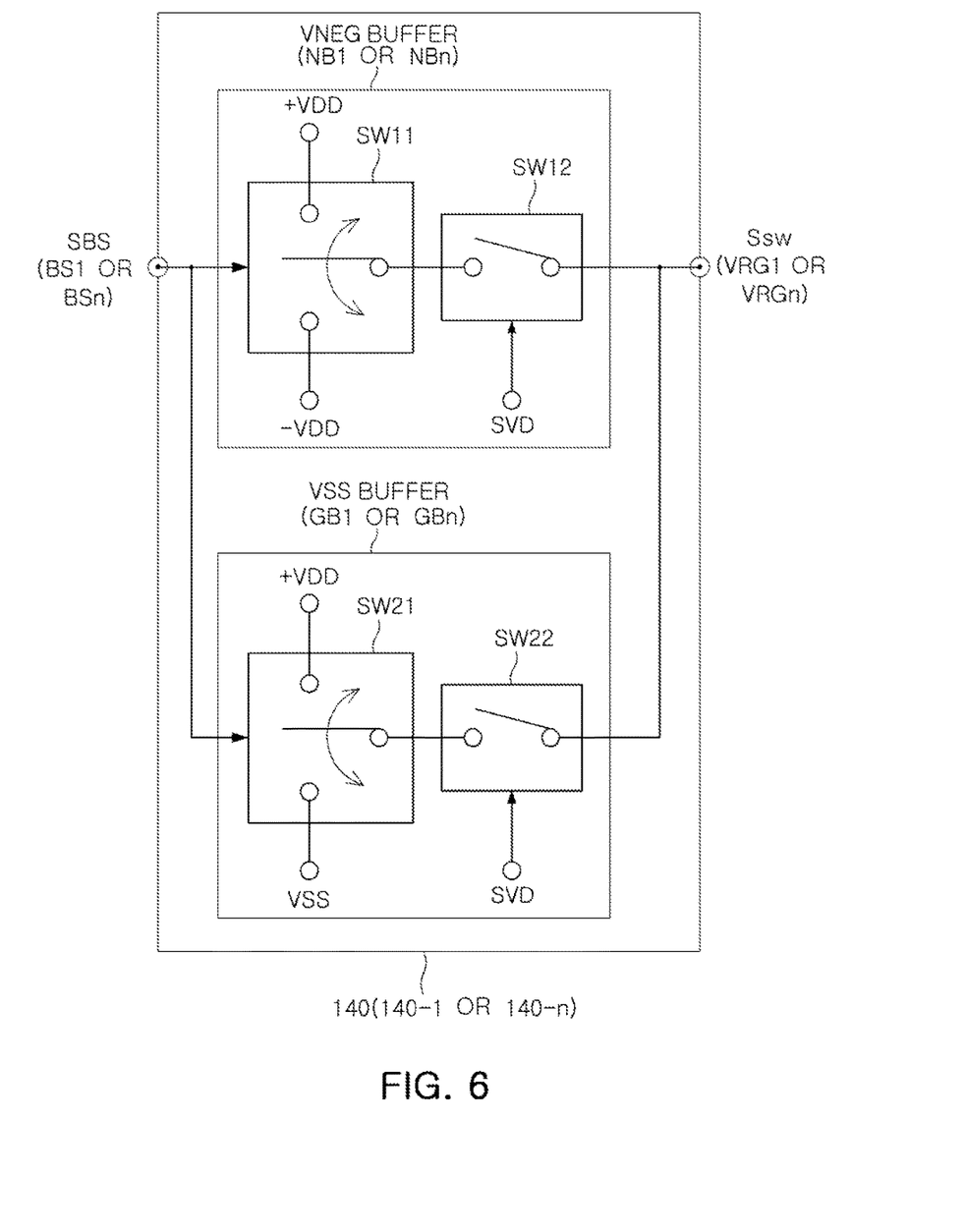
FIG. 6 is a view illustrating first and n-th buffer circuits.

FIG. 6 illustrates an example of first and n-th buffer circuits.

Referring to FIG. 6, the VNEG buffer NB1 or NBn may include a first switch SW11 and a second switch SW12.

As an example, the first switch SW11 may select one of the positive voltage (e.g., +VDD) and the negative voltage (e.g., −VDD) as the switching level voltage of the switching signal Ssw according to the first band selection signal BS1 and provide the selected voltage to the second switch SW12.

As an example, when the first band selection signal BS1 is a high level voltage, the first switch SW11 may select the positive voltage as the switching level voltage of the switching signal Ssw, and when the first band selection signal BS1 is a low level voltage, the first switch SW11 may select the negative voltage as the switching level voltage of the switching signal Ssw.

When the voltage detection signal SVD is the first voltage V1, the second switch SW12 may be in an ON-state and output one of the positive voltage (e.g., +VDD) and the negative voltage (e.g., −VDD) selected by the first switch SW11 as the switching signal Ssw.

On the other hand, when the voltage detection signal SVD is the second voltage V2, the second switch SW12 may be in an OFF-state.

In addition, the VSS buffer GB1 or GBn may include a third switch SW21 and a fourth switch SW22.

The third switch SW21 may select one of the positive voltage (e.g., +VDD) and the ground voltage (e.g., VSS) as the switching level voltage of the switching signal Ssw according to the first band selection signal BS1 and provide it to the fourth switch SW22.

As an example, when the first band selection signal BS1 is a high level voltage, the third switch SW21 may select the positive voltage as the switching level voltage of the switching signal Ssw, and when the first band selection signal BS1 is a low level voltage, the third switch SW21 may select the ground voltage as the switching level voltage of the switching signal Ssw.

When the voltage detection signal SVD is the second voltage V2, the fourth switch SW22 may be in an ON-state and output one of the positive voltage (e.g., +VDD) and the ground voltage (e.g., VSS) selected by the third switch SW21 as the switching signal Ssw.

On the other hand, when the voltage detection signal SVD is the first voltage V1, the fourth switch SW22 may be in an OFF-state.

Figure 7:
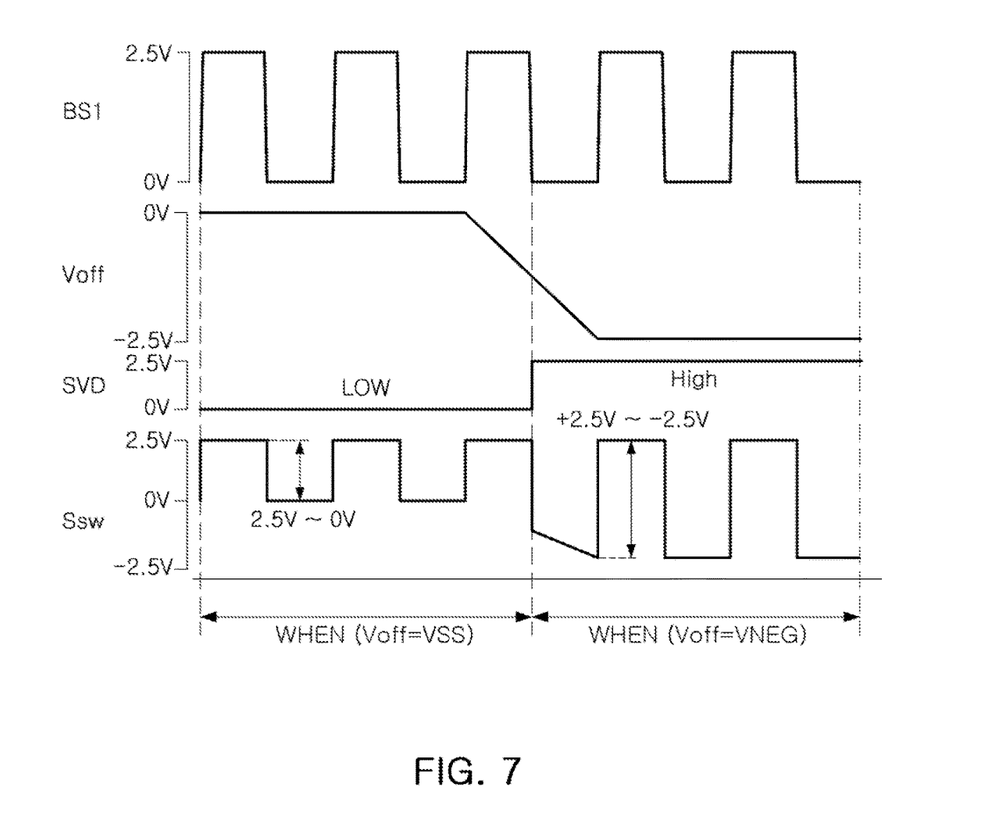
FIG. 7 is a view illustrating voltage levels of a first band selection signal, an off-level voltage, a voltage detection signal, and a switching signal.

FIG. 7 illustrates an example of voltage levels of a first band selection signal, an off-level voltage, a voltage detection signal, and a switching signal.

In FIG. 7, a case in which the off-level voltage Voff is changed from the ground voltage (e.g., VSS=0V) to the negative voltage (e.g., −VDD=−2.5V) will be described, for example, when the first band selection signal BS1 alternately includes a high level voltage (e.g., +2.5V) and a low level voltage (e.g., 0V).

As an example, when the off-level voltage Voff is the ground voltage (e.g., VSS=0V), the voltage detection signal SVD may be a low level, and the switching signal Ssw may be +2.5V or 0V in synchronization with a voltage level of the first band selection signal BS1.

As another example, when the off-level voltage Voff is the negative voltage (e.g., −VDD=−2.5V), the voltage detection signal SVD may be a high level, and the switching signal Ssw may be +2.5V or −2.5V in synchronization with a voltage level of the first band selection signal BS1.

Figure 8:
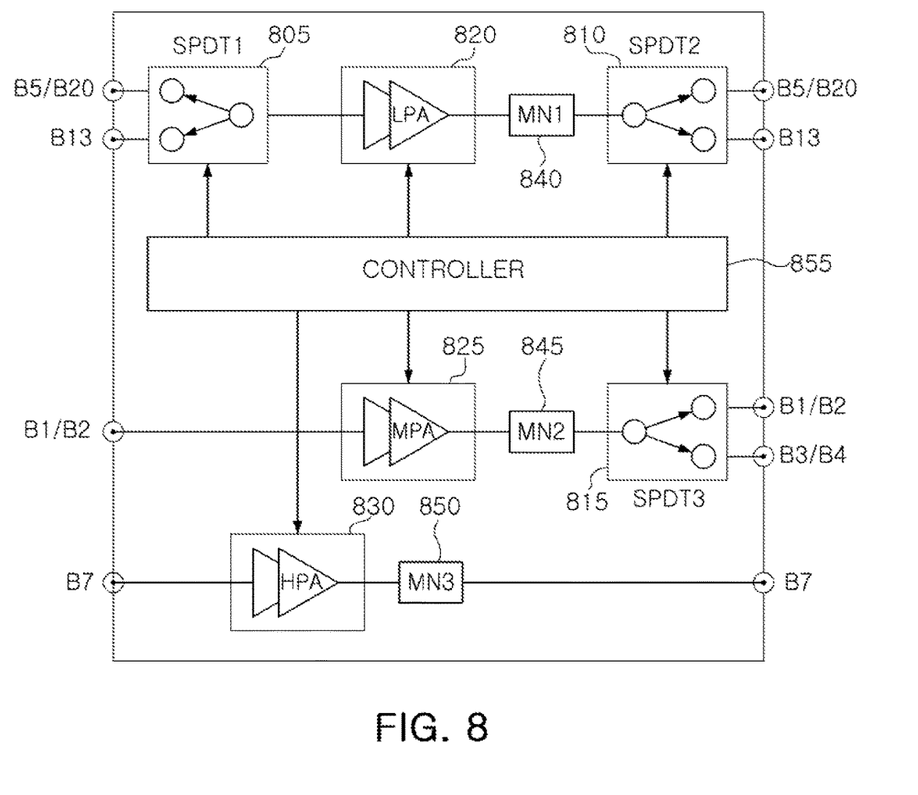
FIG. 8 is a view illustrating an internal block diagram of a power amplifier module (PAM) to which a radio frequency switch is applied.

FIG. 8 illustrates an example of an internal block diagram of a power amplifier module (PAM) to which a radio frequency switch may be applied.

Referring to FIG. 8, a radio frequency switch may be applied to an SPDT switch that selects at least two signal paths. For example, in a case in which the radio frequency switch is applied to a power amplifier module (PAM) including an input SPDT 805 (SPDT1) switch using the ground voltage as the off-level voltage, an output SPDT 810, 815 (SPDT2, SPDT3) switch using the negative voltage as the off-level voltage, a low power amplifier 820 (LPA), a medium power amplifier 825 (MPA), a high power amplifier 830 (HPA), a plurality of matching networks 840 (MN1), 845 (MN2), and 850 (MN3), and a PA controller 855, the radio frequency switch may be applied to the input SPDT 805 (SPDT1) switch and the output SPDT 810, 815 (SPDT2, SPDT3) switch, respectively.

As set forth above, according to various examples, as a control buffer circuit and a radio frequency switch that may be used regardless of a level of an off-level voltage are implemented, since the control buffer circuit and the radio frequency switch may be applied to the respective SPDT switch using different off-level voltages and have the same circuit structure regardless of the off-level voltage, the control buffer circuit and the radio frequency switch may be manufactured through a single manufacturing process without having to be manufactured through different manufacturing processes, thereby reducing the manufacturing cost.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A control buffer circuit comprising:
a voltage detection circuit configured to detect whether a received voltage is a negative voltage or a ground voltage and provide a voltage detection signal based on a result of the detecting; and
a buffer circuit configured to provide a switching signal based on the voltage detection signal,
wherein the switching signal comprises a positive voltage as a switching-on level voltage and includes one of the ground voltage and the negative voltage as a switching-off level voltage.

2. The control buffer circuit of claim 1, wherein the buffer circuit is configured to generate the switching signal based on the voltage detection signal and a band selection signal.

3. The control buffer circuit of claim 2, wherein the voltage detection circuit is configured to provide the voltage detection signal with a first voltage when the received voltage is the negative voltage, and provide the voltage detection signal with a second voltage having a magnitude different from a magnitude of the first voltage when the received voltage is the ground voltage.

4. The control buffer circuit of claim 3, wherein the buffer circuit comprises a first buffer circuit configured to generate a first switching signal determined according to the voltage detection signal and a first band selection signal of the band selection signal.

5. The control buffer circuit of claim 4, wherein the first buffer circuit comprises:
a negative voltage (VNEG) buffer configured to provide one of the positive voltage and the negative voltage as the switching level voltage of the switching signal based on the first band selection signal when the voltage detection signal is the first voltage, and
a ground voltage (VSS) buffer configured to provide one of the positive voltage and the ground voltage as the switching level voltage of the switching signal based on the first band selection signal when the voltage detection signal is the second voltage.

6. The control buffer circuit of claim 3, wherein the buffer circuit comprises first to n-th buffer circuits configured to generate first to n-th switching signals that are determined based on the voltage detection signal and first to n-th band selection signals of the band selection signal.

7. The control buffer circuit of claim 6, wherein the first buffer circuit comprises:
   a VNEG buffer configured to provide one of the positive voltage and the negative voltage as the switching level voltage of the switching signal based on the first band selection signal when the voltage detection signal is the first voltage; and
   a VSS buffer configured to provide one of the positive voltage and the ground voltage as the switching level voltage of the switching signal based on the first band selection signal when the voltage detection signal is the second voltage.

8. The control buffer circuit of claim 6, wherein the n-th buffer circuit comprises:
   a VNEG buffer configured to provide one of the positive voltage and the negative voltage as the switching level voltage of the switching signal based on the n-th band selection signal when the voltage detection signal is the first voltage; and
   a VSS buffer configured to provide one of the positive voltage and the ground voltage as the switching level voltage of the switching signal based on the n-th band selection signal when the voltage detection signal is the second voltage.

9. A radio frequency switch comprising:
   a control buffer circuit configured to generate a switching signal based on a band selection signal and a received voltage; and
   a switching circuit configured to switch at least one signal path in response to receiving the switching signal,
   wherein the control buffer circuit comprises:
   a voltage detection circuit configured to detect a voltage magnitude of the received voltage and provide a voltage detection signal; and
   a buffer circuit configured to provide a switching signal based on the received voltage detection signal.

10. The radio frequency switch of claim 9, wherein the buffer circuit is configured to provide the switching signal based on the received voltage detection signal and the band selection signal.

11. The radio frequency switch of claim 10, wherein the voltage detection circuit is configured to provide the voltage detection signal with a first voltage when the received voltage is the negative voltage, and provide the voltage detection signal with a second voltage having a magnitude different from a magnitude of the first voltage when the received voltage is the ground voltage.

12. The radio frequency switch of claim 11, wherein the buffer circuit comprises a first buffer circuit that is configured to generate a first switching signal that is determined based on the voltage detection signal and a first band selection signal of the band selection signal.

13. The radio frequency switch of claim 12, wherein the first buffer circuit comprises:
   a negative voltage (VNEG) buffer configured to provide one of the positive voltage and the negative voltage as the switching level voltage of the switching signal based on the first band selection signal when the voltage detection signal is the first voltage, and
   a ground voltage (VSS) buffer configured to provide one of the positive voltage and the ground voltage as the switching level voltage of the switching signal based on the first band selection signal when the voltage detection signal is the second voltage.

14. The radio frequency switch of claim 11, wherein the buffer circuit comprises first to n-th buffer circuits that are configured to generate first to n-th switching signals determined based on the voltage detection signal and first to n-th band selection signals of the band selection signal.

15. The radio frequency switch of claim 14, wherein the first buffer circuit comprises:
   a VNEG buffer configured to provide one of the positive voltage and the negative voltage as the switching level voltage of the switching signal based on the first band selection signal when the voltage detection signal is the first voltage; and
   a VSS buffer configured to provide one of the positive voltage and the ground voltage as the switching level voltage of the switching signal based on the first band selection signal when the voltage detection signal is the second voltage.

16. The radio frequency switch of claim 14, wherein the n-th buffer circuit comprises:
   a VNEG buffer configured to provide one of the positive voltage and the negative voltage as the switching level voltage of the switching signal based on the n-th band selection signal when the voltage detection signal is the first voltage; and
   a VSS buffer configured to provide one of the positive voltage and the ground voltage as the switching level voltage of the switching signal based on the n-th band selection signal when the voltage detection signal is the second voltage.

17. A radio frequency switch comprising:
   a voltage detection circuit configured to:
   detect a magnitude of a voltage; and
   generate a voltage detection signal based on the detected magnitude of the voltage;
   a control buffer configured to generate a switching signal based on a value of the voltage detection signal; and
   a switching circuit configured to perform an operation of switching one or more signal paths in response to receiving the switching signal.

18. The radio frequency switch of claim 17, wherein the detecting of the magnitude of the voltage comprises determining whether the detected voltage is a negative voltage (VNEG) or a ground voltage (VSS).

19. The radio frequency switch of claim 18, wherein the voltage detection circuit is further configured to provide the voltage detection signal with a first voltage when the detected voltage is VNEG, and provide the voltage detection signal with a second voltage having a magnitude different from a magnitude of the first voltage when the detected voltage is VSS.

20. The radio frequency switch of claim 18, wherein the control buffer is configured to generate a plurality of switching signals based on a value of the voltage detection signal, and the switching circuit is configured to perform an operation of switching a plurality of signal paths in response to receiving the switching signal.

* * * * *